(12) United States Patent
Eckert et al.

(10) Patent No.: US 9,627,017 B1
(45) Date of Patent: Apr. 18, 2017

(54) RAM AT SPEED FLEXIBLE TIMING AND SETUP CONTROL

(71) Applicant: International Business Machines Corporation, Armonk, NY (US)

(72) Inventors: Martin Eckert, Moetzingen (DE); Michael B. Kugel, Boeblingen (DE); Otto A. Torreiter, Leinfelden-Echterdingen (DE); Tobias Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/863,689

(22) Filed: Sep. 24, 2015

(51) Int. Cl.
G11C 11/00 (2006.01)
G11C 7/22 (2006.01)
G11C 29/12 (2006.01)
G11C 7/10 (2006.01)

(52) U.S. Cl.
CPC .............. G11C 7/22 (2013.01); G11C 7/10 (2013.01); G11C 29/12 (2013.01)

(58) Field of Classification Search
None
See application file for complete search history.

(56) References Cited

U.S. PATENT DOCUMENTS

| 6,560,740 | B1 | 5/2003 | Zuraski, Jr. et al. |
| 7,284,166 | B2 | 10/2007 | Zappa et al. |
| 7,954,017 | B2 | 5/2011 | Kashyap et al. |
| 8,719,761 | B2 | 5/2014 | Card et al. |
| 8,853,847 | B2 | 10/2014 | Gorman et al. |
| 2004/0190331 | A1* | 9/2004 | Ross ............ G11C 29/1201 365/154 |
| 2006/0184848 | A1* | 8/2006 | Serizawa ....... G01R 31/318569 714/727 |
| 2014/0110711 | A1 | 4/2014 | Gorman et al. |
| 2014/0177371 | A1 | 6/2014 | Ellis et al. |

(Continued)

FOREIGN PATENT DOCUMENTS

| JP | 07093998 A | 4/1995 |
| WO | 0239460 A2 | 5/2002 |

OTHER PUBLICATIONS

U.S. Appl. No. 14/928,261, filed Oct. 30, 2015, Entitled "RAM at Speed Flexible Timing and Setup Control".

(Continued)

*Primary Examiner* — Son Dinh
*Assistant Examiner* — Sultana Begum
(74) *Attorney, Agent, or Firm* — Alex A. Ashworth

(57) ABSTRACT

Embodiments of the present invention provide systems and methods for a RAM at speed flexible timing and setup control. The memory module includes: a module connected to a functional logic circuitry; first timing control latches of a first scan-in chain; a timing configuration circuitry controllable by timing and control configuration signals; selection circuits connected to each output line of the first timing control latches; and an output signal of the timing configuration circuitry is connected to input lines of the selection circuits, such that two sets of control data are operatively connected to the control input lines of the memory cells under test, without a reloading of the respective timing control latches.

12 Claims, 4 Drawing Sheets

(56) References Cited

U.S. PATENT DOCUMENTS

2015/0109848 A1   4/2015   Adham et al.

OTHER PUBLICATIONS

Appendix P: List of IBM Patents or Patent Applications Treated as Related, dated Oct. 30, 2015, 2 pages.
Kahng et al., "Co-Optimization of Memory BIST Grouping, Test Scheduling, and Logic Placement", Design, Automation and Test in Europe Conference and Exhibition (DATE), Mar. 24-28, 2014, 6 pages.

* cited by examiner

RAM AT SPEED FLEXIBLE TIMING AND SETUP CONTROL

BACKGROUND OF THE INVENTION

The present invention relates generally to the field of memory, and more particularly to a memory module connected to a functional logic, with flexible timing and setup control signals.

Because semiconductor chips, like embedded static random access memory (SRAM) or embedded dynamic random access memory (eDRAM), become more and more complex, related testing processes may be enhanced in their capabilities and flexibility. With increasing speed—i.e., increasing clock frequency—constraints in a timing of signals increase as well. A correct timing of critical signals within such a semiconductor chip becomes paramount to its reliability. Thus, testing methods and timing diagrams for semiconductor devices under test may reflect the critical timing signals in order to guarantee a high reliability of the tested semiconductor chips.

Often, such chips are equipped with built-in self-test (BIST) capabilities. Scan-in chains often deliver the required timing input signals for a device under test. Once a scan-in chain has been filled, a timing of the signals is often fixed. Flexible timing control setup values, such as default values versus maximum frequency values, relaxation times, and so on, may often not be individually altered, assigned, and used during a built-in self-test.

SUMMARY

According to one embodiment of the present invention, a memory module is provided, the memory module comprising: a module connected to a functional logic circuitry; a plurality of first timing control latches of a first scan-in chain; a timing configuration circuitry controllable by timing and control configuration signals; a plurality of selection circuits, wherein each output line of said plurality of said first timing control latches is connected to respective input lines of said selection circuits, and wherein output lines of said selection circuits are connected to a plurality of respective control input lines of memory cells under test; and wherein an output signal of said timing configuration circuitry is connected to input lines of said selection circuits, such that two sets of control data are operatively connected to said plurality of control input lines of said memory cells under test, without a reloading of said plurality of respective timing control latches.

According to another embodiment of the present invention, a method for operating a memory module is provided, comprising: switching between two sets of control data as input signals for a plurality of control input lines of memory cells under test by an output signal of a timing configuration circuitry, which is connected to input lines of selection circuits such that said switching is performed without a reloading of said plurality of respective timing control latches.

DETAILED DESCRIPTION

Figure 1:
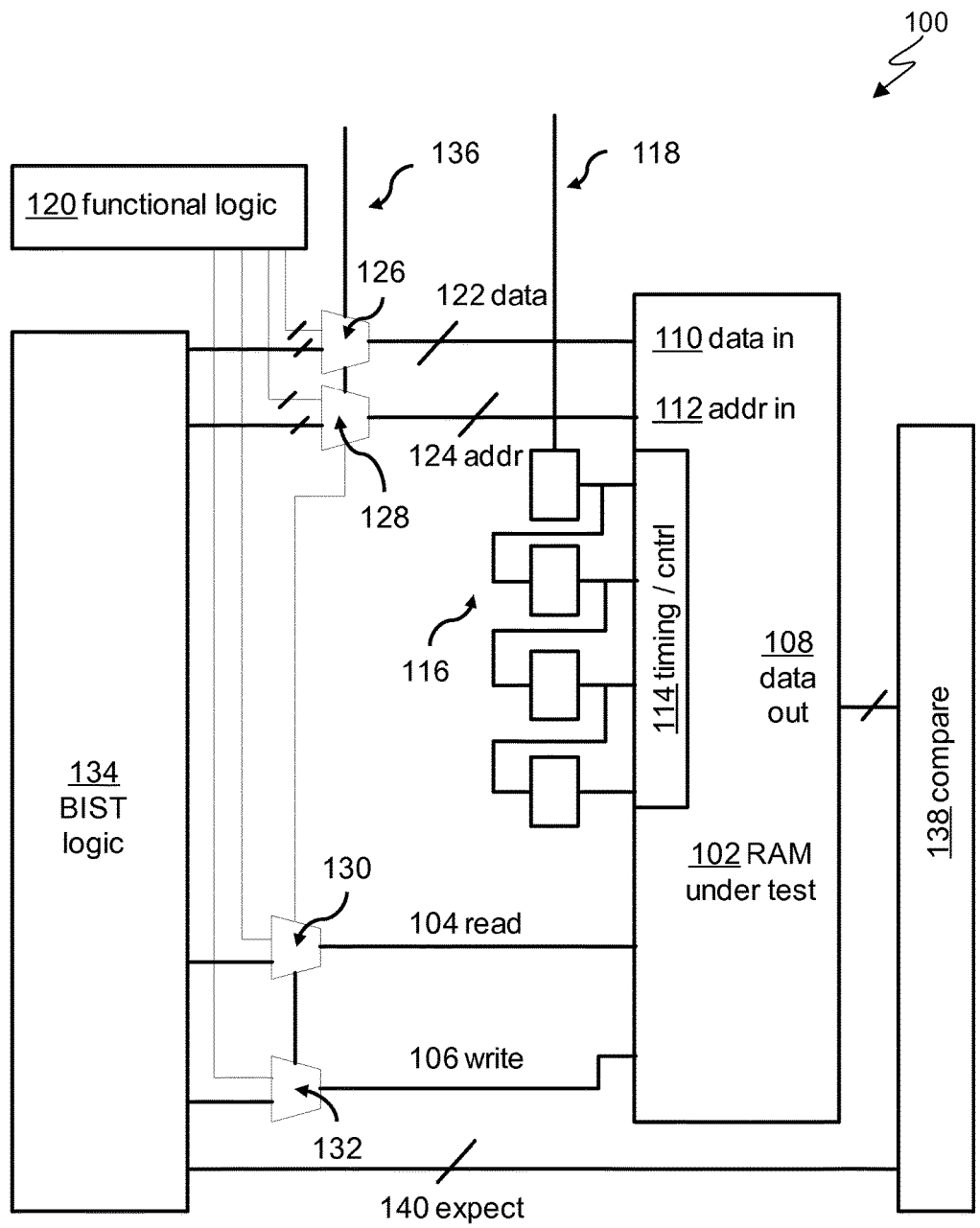
FIG. 1 depicts a block diagram illustrating a memory module without the timing configuration circuitry, in accordance with an embodiment of the present invention.

In the context of this description, the following conventions, terms and/or expressions may be used:

The term 'memory module' may denote a semiconductor-based memory chip or part of a chip, e.g., embedded in additional digital logic circuitry. The memory module may comprise a RAM (random access memory) section to be tested. Functional logic may also be present.

The term 'functional logic circuitry' may denote a digital circuitry to support or use the memory elements of the memory module. The functional logic circuitry may, for example, comprise input/output circuitry for a proper usage of the memory elements. The functional logic circuitry may also comprise a processor or other processing devices in case the memory may be an embedded memory like an SRAM or an eDRAM of a larger logical complex like a CPU.

The term 'timing control latches' may denote latches of a scan-in chain enabling a separate controlling of timing and control input signals for a related RAM under test. The scan-in chain latches may be filled sequentially due to its chained characteristic.

The term 'scan-in chain' may denote a set of serialized scan-in latches. In typical traditional set-ups one scan-in chain per RAM under test may be implemented and used by a BIST circuitry.

The term 'timing configuration circuitry' may denote a dedicated set of logical gates and corresponding wiring for flexibly changing timing and control signals for a device under test, e.g., a RAM (random access memory). These dedicated logical elements like latches, AND gates, and/or OR gates may represent a method to control timing and control input signals for devices under test.

The term 'selection circuit' may denote a gateway circuit allowing a selection which input signals may be routed through to an output of the selection circuit. A typical implementation of a selection circuit may be a multiplexer or an AND gate.

The term 'timing/control input lines' also referred to as "timing and control lines" may denote dedicated input lines of a device, e.g., a RAM, instrumental for controlling timing signals for specific functions within the device. Especially, for testing purposes these 'timing/control input lines' may be used in order to set the device into a predefined status which may not always be present in a functional mode of the device.

The term 'multiplexer' may denote an electronic gate allowing a dedicated selection of input signals to be routed through to output signals of the selection circuit.

The term 'built-in self-test logic circuitry' (BIST) may denote electronic circuitry dedicated to generate test signals for a device to be tested. Such test may be performed, e.g., during a start-up procedure of a complex semiconductor chip or on demand, like during a specific test phase which the complex semiconductor chip has to undergo as a part of a quality assurance process. The built-in self-test functions may be triggered internally or externally. They may function as a stand-alone BIST function or together with external test circuitries.

The term 'range control circuitry' may denote and may be implemented as a counter for generating timing control signals for a predefined, changeable range of clock cycles. An implementation option may be 'start/stop counter' triggered with, e.g., clock cycle impulses.

The term 'range latch' may denote a latch as part of the timing configuration circuitry dedicated to the range control function.

The term 'access latch' may denote a latch of the timing configuration circuitry dedicated to a read or write enable signal.

In the following, a detailed description of the figures will be given. All instructions in the figures are schematic. Firstly, a block diagram of an embodiment of the inventive memory module is given. Afterwards, further embodiments as well as embodiments of the method for operating a memory module connected to a functional logic circuitry will be described.

FIG. 1 depicts a block diagram illustrating a memory module 100 without the timing configuration circuitry, in accordance with an embodiment of the present invention.

A RAM under test 102 has read and write and able input ports, as well as, output data 108. Additionally, the RAM under test 102 has a set of parallel data input lines 110 and address input lines 112. Additionally, the RAM under test 102 comprises timing/control input 114 connected to output lines of latches 116 (only one of the latches as a reference numeral) of a scan-in chain. The scan-in chain may be serially filled via line 118. A functional logic 120, instrumental for additional functionality required to operate the RAM under test 102, may generate data 122 and address 124 signals. Examples of the functional logic 120 may be interface functions to, for example, a processor logic (not shown). This may be required if the RAM under test 102 may be embedded in a larger logic complex.

Additionally, a built-in self-test logic 134 may be present. This built-in self-test logic 134 may generate read 104 and/or write 106 and able signals. In this embodiment, multiplexers 126, 128, 130, and 132 are located between the built-in self-test logic 134, and the RAM under test 102 may be controlled by a test enable signal 136. A compare logic 138 may compare the output data (data out) 108 of the RAM under test 102 with the expected data 140 generated by the built-in self-test logic 134. In this embodiment, if the comparison in the compare logic 138 shows no difference between the expected data 140 and the output data 108, then that respective test cycle may be named successful.

Now, individual details of the proposed memory module 100 will be described. Afterwards, in the context of FIG. 2, it will be described how these elements may fit into the set-up according to FIG. 1.

According to an exemplary embodiment of the memory module 100, a change between the two sets of timing/control data may be connectable to the plurality of timing/control input lines of the memory cells under test, and may be performed from one clock cycle to a next clock cycle. This may enable a fast switch from one set of scan-in chain values to another set of scan-in chains values for the device under test.

Hence, according to one preferred embodiment of the memory module 100, a second set of latches of a second scan-in chain may be implemented, wherein each output line of the plurality of the second timing control latches may be connected to respective input lines of the selection circuits. The selection circuits in front of the timing and control input lines of the device under test is instrumental for selecting between the two scan-in chains. The selection circuits may allow a selection of which scan-in chain signals may be applied. It may be noted that the second scan-in chain may be seen as a physical extension of the first scan-in chain. Alternatively, it may also be possible to fill the first and second scan-in chain separately in a serialized manner. Two input signals for a filling of the scan-in chains may then be required.

According to one embodiment of the memory module 100, the selection circuits may be multiplexers. According to another embodiment of the memory module 100, the selection circuits are AND gates. This second set-up may allow using standards or default values as second scan-in chain values.

According to an exemplary embodiment of the memory module 100, a built-in self-test logic 134 may be present as part of the memory module 100. This may allow generating the test and control signals if latches 116 of the scan-in chain applies signals to the timing/control input 114 of the device under test.

According to a preferred embodiment of the memory module 100, the built-in self-test logic 134 may comprise a range control circuitry including a start/stop counter, wherein an output line of the range control circuitry may be connected to a range input line of the timing configuration circuitry. Such signals may be used additionally to influence the timing and control input lines of the device under test.

According to one embodiment of the memory module 100, the timing configuration circuitry may comprise a range latch connected with its output line to an input line of a range AND gate. The timing configuration circuitry may further comprise an access latch—in particular a read and/or a write enable latch, or in the case that the device under test is a CAM, a compare latch—connected with its output line to an input line of a respective access AND gate (one for read, another one for write). These may again be for read, write, and/or compare commands. An output line of the range AND gate and/or an output line of the access AND gate may each be connected to input lines of an OR gate.

According to one embodiment of the memory module 100, the range input line of the timing configuration circuitry may be connected to an input line of the range AND gate, and/or an access enable output signal of the built-in self-test logic 134 may be connected to an input line of the access AND gate. This may be implemented indirectly, i.e., via a write enable multiplexer.

According to a further embodiment of the memory module 100, a range output line of the functional logic may be connected to the range input line of the timing configuration circuitry, and/or an access—i.e., read and/or write—output line of the functional logic may be connected—either directly or indirectly—to the input line of the access AND gate.

According to yet another embodiment of the memory module 100, an output line of the OR gate is connected to the selection circuits. This may be used for a selection of the scan-in chain signals for the device under test.

According to one additional embodiment of the memory module 100, a compare logic 138 receiving output data 108 of the RAM under test 102 and expected data 140 from the built-in self-test logic 134 may be implemented for control of a correctly performed test cycle.

According to embodiments of the memory module 100, the memory module 100 may be a random access memory or RAM, or a content addressable memory or CAM. Thus, the proposed method may represent advanced testing options for both types of memories.

Figure 2:
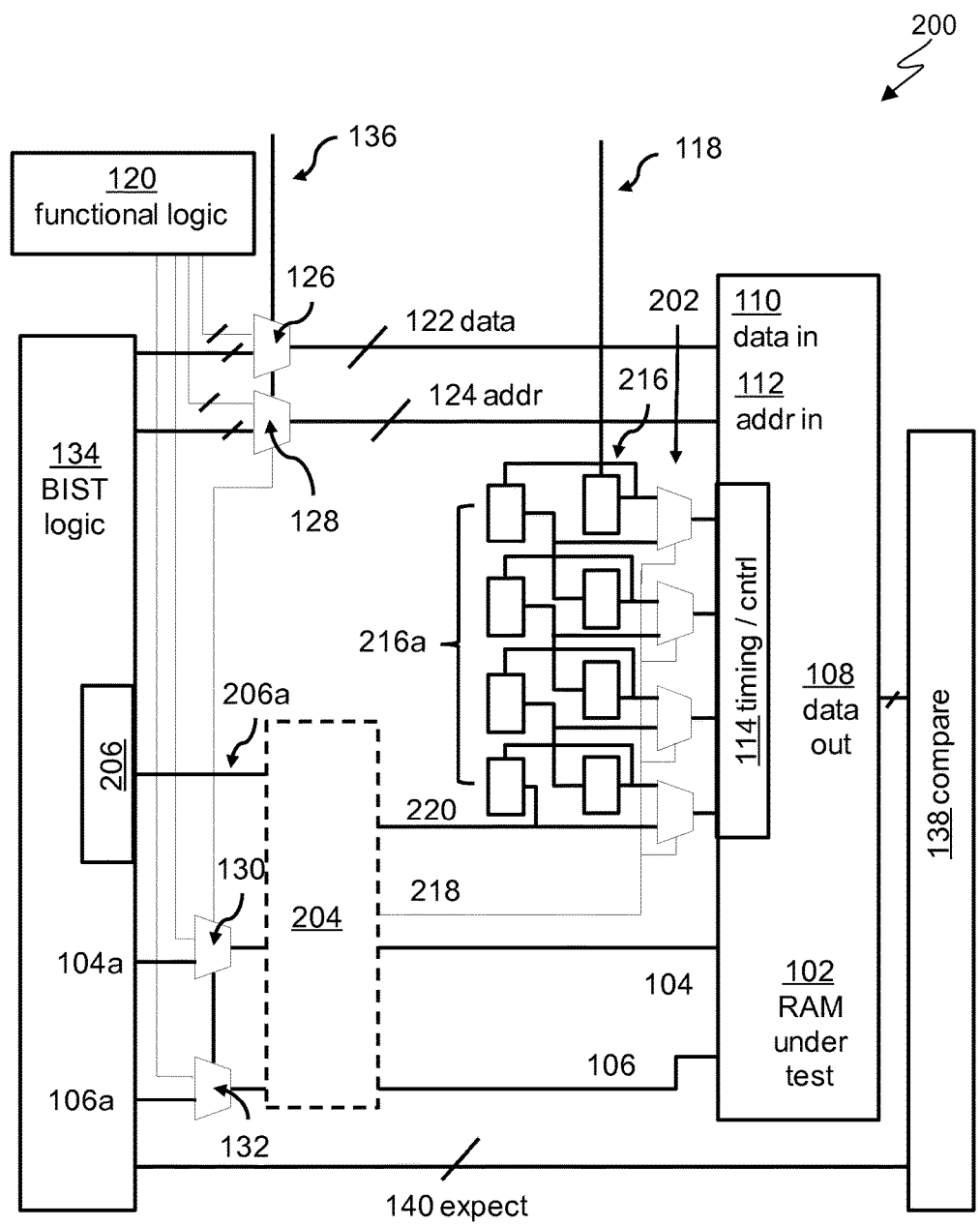
FIG. 2 depicts a block diagram of a memory module, in accordance with an embodiment of the present invention.

FIG. 2 depicts a block diagram of a memory module 200, in accordance with an embodiment of the present invention. Components which are identical to those already discussed from FIG. 1 are shown with the same reference numeral or a reference numeral which is different only in the first digit.

In this embodiment, two banks of scan-in latches 216 and 216a of two scan-in chains are shown (not all have reference numerals—a skilled person will be able to extend the meaning of only one reference numeral to related objects). Additionally, in front of the timing/control input 114 of the RAM under test 102 selection circuits in the form of multiplexers 202 are shown. Corresponding output lines of individual latches of the two sets of scan-in latches 216 and 216a are used as input signals for the multiplexers 202. A switch/select control signal 218 to the multiplexers 202 is generated from the timing configuration circuitry 204. The timing configuration circuitry 204 comprises logic for a more flexible selection of timing/control input 114 for RAM under test 102 (or CAM). The timing configuration circuitry 204 may also provide the read 104 and write 106 enable signals to the RAM under test 102. The timing configuration circuitry 204 may receive these signals via multiplexers 130 and 132 from the built-in self-test logic 134.

Additionally, in this embodiment, the timing configuration circuitry 204 is connected via line 220 to the last scan-in chain latch. In this manner, latches inside the timing configuration circuitry 204 may also be loaded with predefined values. In other embodiments, the latches inside the timing configuration circuitry 204 may be preset using an alternative mechanism.

In this embodiment, the built-in self-test logic 134 comprises a pattern range control start/stop counter 206. A range output signal 206a of this pattern range control start/stop counter 206 may also be applied to the timing configuration circuitry 204. The timing configuration circuitry 204 may enable a switching between the two sets of latches 216 and 216a and output values of the two scan-in chains within one clock cycle. The read enable signal 104a, write enable signal 106a, and the range output signal 206a may be denoted as the above mentioned timing and control configuration signals for the timing configuration circuitry 204.

Figure 3:
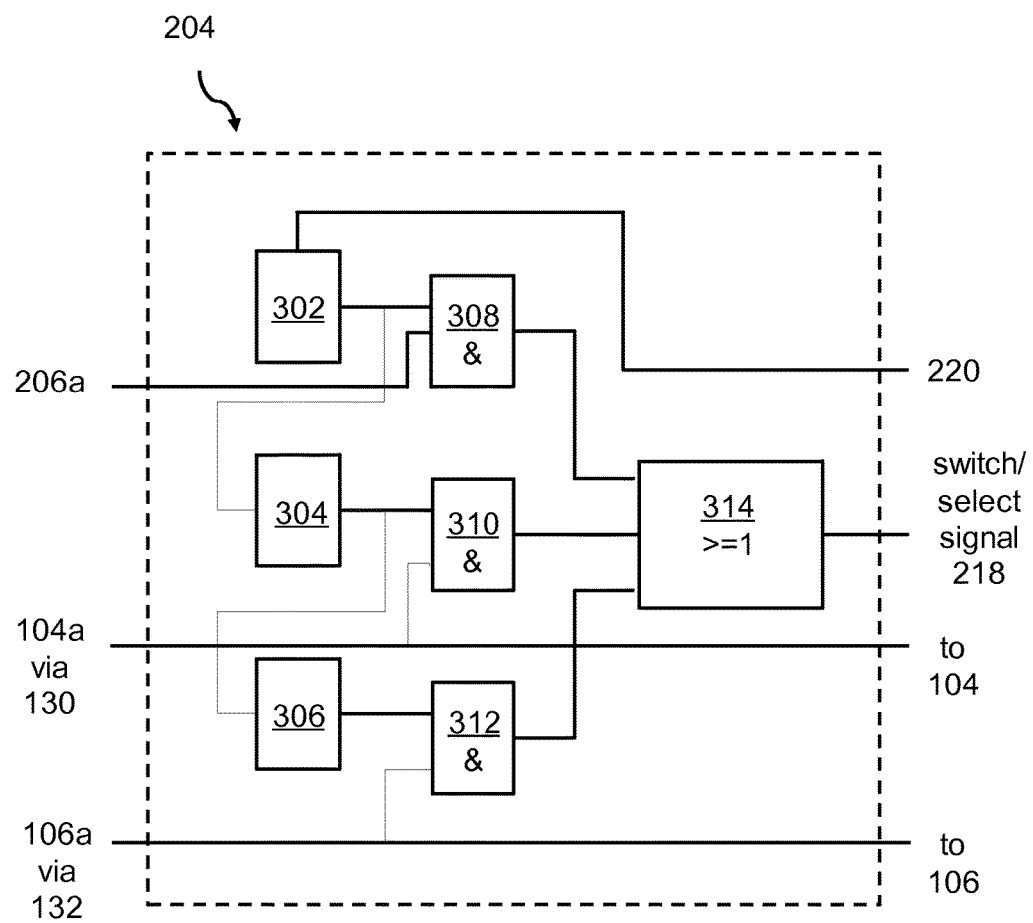
FIG. 3 depicts a block diagram illustrating the timing configuration circuitry of FIG. 2, in accordance with an embodiment of the present invention.

FIG. 3 depicts a block diagram illustrating the timing configuration circuitry 204 of FIG. 2, in accordance with an embodiment of the present invention.

Timing configuration circuitry 204 comprises at least one out of three latches 302, 304, and 306, and the corresponding AND gates 308, 310, and 312 of which output signals are connected to an OR gate 314. The output of the OR gate 314 is used as switch/select control signal 218 of the multiplexers 202. In this embodiment, the latches 302, 304, and 306 may be connected in a chained way and may be seen as an extension of the scan-in chain(s). Output signals of these latches 302, 304, 306 are used as input signals of the corresponding AND gates 308, 310, 312. Second input lines of the AND gates 308, 310, 312 are generated enable signals—read enable 104a, write enable 106a, or range enable 206a of the pattern range control start/stop counter 206.

It may be noted, that the timing/control input 114 to the RAM under test 102 may change from one read to a next write cycle of the RAM under test 102 because in-between—from one clock cycle to the next—a switch from one set of latches 216 to another set of latches 216a of the second scan-in chain can be performed. The start/stop counter of the related pattern range control start/stop counter 206 may be instrumental for applying different sets of scan-in chain signals to the timing/control input 114 of the RAM under test 102. For example, a first set of scan-in chain signals may be applied for a write command and a second set of scan-in chain signals may be applied for a subsequent read command. A subsequent write command may be performed again using the first set of scan-in chain signals.

Alternatively, and as another example, a first set of scan-in chain signals may be applied for a write command, then, for example, for the next 10 subsequent read commands a second set of scan-in chain signals may be applied to the RAM under test 102; and for a subsequent next write command again the first set of scan-in chain signals may be applied to the timing/control input 114 of RAM under test 102. From one clock cycle to a next clock cycle, a complete set of scan-in chain signals from related scan in latches 216 or 216a may be switched and applied to the timing/control input 114 of RAM under test 102. This may allow for more flexible testing scenarios for RAM under test 102. Additionally, this flexible timing and control signal set-up may also be used by the functional logic 120 under the normal function of the memory module 200.

Figure 4:
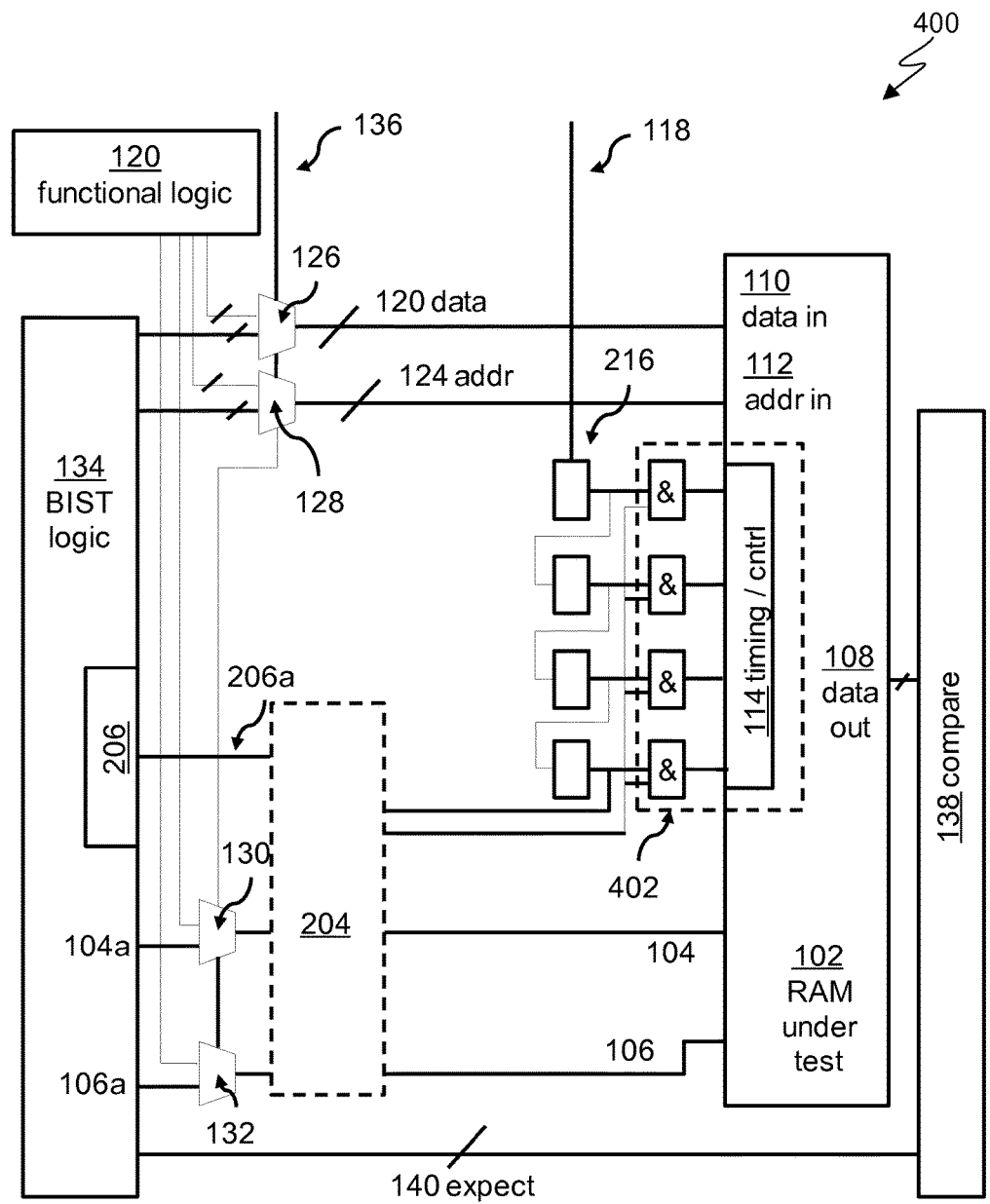
FIG. 4 depicts a block diagram of a memory module, in accordance with another embodiment of the present invention.

FIG. 4 depicts a block diagram of a memory module 400, in accordance with another embodiment of the present invention.

In this embodiment, only one set of latches 116 of a scan-in chain is implemented. However, the multiplexers 202 may now be implemented as AND gates 402 (only one of the AND gates has a reference numeral) which may be part of the timing/control input 114 of the RAM under test 102. In other embodiments, the AND gates 402 may be implemented separately to the timing/control input 114. If no output signal of the AND gates 402 is present (logical zeros), default values generated in the timing/control input 114 of the RAM under test 102 may be used as a selectable second set of scan-in chain signals. Thus, memory module 400 may switch between two sets of scan-in chain signals from one clock cycle to a next clock cycle. However, one set of the scan-in chain signals may always be default values. The default values may be, for example, a set according to predefined values. However, an easy implementation may be to set the default to "all zeros", or "all ones". However, other combinations may be possible. This embodiment may help in reducing the complexity of the scan-in chain(s), while still allowing for the usage of the pattern range control start/stop counter 206, as well as, range settings for different sets of scan-in chain signals for different read or write cycles to the RAM under test 102.

Accordingly, the proposed setup of the memory module, including the timing configuration circuitry, allows a higher flexibility in the timing signals for the timing and control input lines to the device under test, e.g., a RAM under test. Only a limited number of additional circuits have to be added to the memory module in order to increase the flexibility and timing and control signals for the device under test. By adding a second set of timing/control latches—i.e., a second scan-in chain—it may be possible to switch between two sets of timing and control signals within one clock cycle. For changing timing and control signals according to the state-of-the-art, the complete scan-in chain would have to be refilled, which may require as many clock cycles as there are latches in the scan-in chain for timing and control signals for the device under test.

Additionally, the pattern range control start/stop counter inside the BIST logic may allow an individual setup for a write, a read access or even complete pattern subsections, i.e., ranges. Control latches for read access, write access or range access may be functionally disjoined from the functional logic of the semiconductor chip in which the circuit under test—e.g., SRAM or eDRAM—may be embedded. This may provide the flexibility to decide which timing and control signals may be applied to which access or pattern type based on a short and dedicated scan-in chain load process.

In addition, the setting of read and write timing bit switching capabilities may also be applicable for a regular, non-BIST, functional operation of the functional logic in case of a need for individual tuning requirements.

In some embodiments, the invention may also be applied to a single scan-in chain if the multiplexers in front of the timing control input signals to the device under test may be implemented as AND gates. This concept may be combined with the concept of default values for the timing and control input signals. Thus, if no signals may be applied from the scan-in chain, default values may be applied to the timing and control input signals of the device under test. Thus, within one clock cycle, two sets of timing and control signals may be applied to the device under test: the signals from the loaded scan-in chain, or, alternatively, the default values, (e.g., "all zeros").

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A memory module comprising:
 a module connected to a functional logic circuitry;
 a plurality of first timing control latches of a first scan-in chain;
 a timing configuration circuitry controllable by timing and control configuration signals, wherein the timing configuration circuitry provides a read and a write enable signal to a memory cell under test, and wherein the timing configuration circuitry is connected to a last scan-in chain latch, wherein a plurality of latches inside the timing configuration circuitry are loaded with predefined values;
 a plurality of selection circuits, wherein each output line of said plurality of said first timing control latches is connected to respective input lines of said selection circuits, and wherein output lines of said selection circuits are connected to a plurality of respective control input lines of memory cells under test; and
 wherein an output signal of said timing configuration circuitry is connected to input lines of said selection circuits, such that two sets of control data are operatively connected to said plurality of control input lines of said memory cells under test, without a reloading of said plurality of respective timing control latches, wherein a change between said two sets of control data operatively connected to said plurality of control input lines of said memory cells under test, is performed from a first clock cycle to a second clock cycle, wherein a first set of the input signals are applied for a write command and a second set of the input signals are applies for a subsequent read command, such that different sets of input signals are applied to the timing control input lines of said memory cells under test.

2. The memory module of claim 1, further comprising:
 a second set of latches of a second scan-in chain, wherein each output line of said plurality of said second timing control latches is connected to respective input lines of said selection circuits.

3. The memory module of claim 1, wherein said selection circuits are multiplexers.

4. The memory module of claim 1, wherein said selection circuits are AND gates.

5. The memory module of claim 1, further comprising: a built-in self-test logic circuitry.

6. The memory module of claim 5, wherein said built-in self-test logic circuitry comprises: a range control circuitry comprising a counter, wherein an output line of said range control circuitry is operatively connected to a range input line of said timing configuration circuitry.

7. The memory module of claim 6, wherein said timing configuration circuitry comprises at least one of:
 a range latch connected by an output line to an input line of a range AND gate; and
 an access latch connected by an output line to an input line of an access AND gate, wherein an output line of said range AND gate is connected to input lines of an OR gate and an output line of said access AND gate is connected to input lines of an OR gate.

8. The memory module of claim 7, wherein: said range input line of said timing configuration circuitry is connected to an input line of said range AND gate; and an access enable output signal of said built-in self-test logic circuitry is connected to an input line of said access AND gate.

9. The memory module of claim 7, wherein a range output line of said functional logic is connected to said range input line of said timing configuration circuitry; and an access output line of said functional logic is connected to said input line of said access AND gate.

10. The memory module of claim 7, wherein an output line of said OR gate is connected to said selection circuits.

11. The memory module of claim 7, further comprising:
 a compare circuitry receiving output data of said memory module under test; and
 expected output data from said built-in self-test logic circuitry.

12. The memory module of claim 1, wherein said memory module is one of: a random access memory (RAM) and a content addressable memory (CAM).

* * * * *